United States Patent
Aoki et al.

(10) Patent No.: US 6,816,012 B2
(45) Date of Patent: Nov. 9, 2004

(54) DISTRIBUTED CIRCULAR GEOMETRY POWER AMPLIFIER ARCHITECTURE

(75) Inventors: Ichiro Aoki, Arcadia, CA (US); Seyed-Ali Hajimiri, Pasadena, CA (US); David B. Rutledge, Pasadena, CA (US); Scott David Kee, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/974,578

(22) Filed: Oct. 9, 2001

(65) Prior Publication Data

US 2002/0135422 A1 Sep. 26, 2002

Related U.S. Application Data

(60) Provisional application No. 60/239,470, filed on Oct. 10, 2000, provisional application No. 60/239,474, filed on Oct. 10, 2000, and provisional application No. 60/288,601, filed on May 4, 2001.

(51) Int. Cl.[7] .............................................. H03F 3/26
(52) U.S. Cl. ...................................... 330/276; 330/262
(58) Field of Search ................................ 330/146, 276, 330/286, 330, 292, 295, 307

(56) References Cited

U.S. PATENT DOCUMENTS

| | | | |
|---|---|---|---|
| 3,098,200 A | * 7/1963 | Jensen | 330/276 |
| 3,157,839 A | * 11/1964 | Brown | 330/276 |
| 4,283,685 A | 8/1981 | MacMaster et al. | 330/286 |
| 4,305,043 A | 12/1981 | Ho et al. | 330/53 |
| 5,066,925 A | * 11/1991 | Freitag | 330/286 |
| 5,130,664 A | 7/1992 | Pavlic et al. | 330/55 |
| 5,208,725 A | 5/1993 | Akcasu | 361/313 |
| 5,223,800 A | 6/1993 | Karsten, Jr. et al. | 330/54 |
| 5,920,240 A | 7/1999 | Alexanian et al. | 333/127 |
| 5,939,766 A | 8/1999 | Stolmeijer et al. | 257/534 |
| 6,057,571 A | 5/2000 | Miller et al. | 257/296 |
| 6,121,842 A | 9/2000 | Adlerstein et al. | 330/307 |
| 6,383,858 B1 | 5/2002 | Gupta et al. | 438/238 |
| 6,385,033 B1 | 5/2002 | Javanifard et al. | 361/306.2 |
| 6,417,535 B1 | 7/2002 | Johnson et al. | 257/306 |
| 6,448,847 B1 | * 9/2002 | Paul et al. | 330/252 |

FOREIGN PATENT DOCUMENTS

| | | |
|---|---|---|
| DE | 12 76 764 B | 9/1968 |
| EP | 0 379 202 A | 7/1990 |
| EP | 0 556 398 A | 8/1993 |
| FR | 1 413 073 A | 10/1965 |

OTHER PUBLICATIONS

"The Modeling, Characterization, and Design of Monolithic Inductors for Silicon RF IC's", Long, et al, *IEEE Journal of Solid–State Circuits*, vol. 32, No. 3, pp. 357–369, Mar. 1997.

(List continued on next page.)

*Primary Examiner*—Khanh Van Nguyen
(74) *Attorney, Agent, or Firm*—Christopher J. Rourk

(57) ABSTRACT

The present invention discloses a distributed power amplifier topology and device that efficiently and economically enhances the power output of an RF signal to be amplified. The power amplifier comprises a plurality of push-pull amplifiers interconnected in a novel circular geometry that preferably function as a first winding of an active transformer having signal inputs of adjacent amplification devices driven with an input signal of equal magnitude and opposite phase. The topology also discloses the use of a secondary winding that matches the geometry of primary winding and variations thereof that serve to efficiently combine the power of the individual power amplifiers. The novel architecture enables the design of low-cost, fully-integrated, high-power amplifiers in the RF, microwave, and millimeter-wave frequencies.

44 Claims, 12 Drawing Sheets

OTHER PUBLICATIONS

"High Power–Added Efficiency MMIC Amplifier for 2.4 GHz Wireless Communications," Portilla. et al., *IEEE Journal of Solid–State Circuits*, vol. 34, No. 1, Jan., 1999.

"A 1.9–GHz, 1–W CMOS Class–E Power Amplifier for Wireless Communications," King–Chun Tsai. et al., *IEEE Journal of Solid–State Circuits*, vol. 34, No. 7, pp. 962–970, Jul., 1999.

"A Monolithic Transformer Coupled 5–W Silicon Power Amplifier with 59% PAE at 0.9 GHz," Simbürger, et al., *IEEE Journal of Solid–State Circuits*, vol. 34, No. 12, pp. 1881–1892, Dec., 1999.

"A Monolithic 2.5 V. 1 W Silicon Bipolar Power Amplifier With 55% PAE at 1.9 GHz," Simbüuger, et al., *IEEE MTT–S Digest*, pp. 853–856, 2000.

"A Common–Gate Switched. 0.9W Class–E Power Amplifier with 41% PAE in 0.25 µm CMOS," Yoo, et al. Integrated Systems Laboratory (IIS), Swiss Federal Institute of Technology (ETH), Zurich, Switzerland, *2000 Symposium on VLSI Circuits Digest of Technical Papers*, pp. 56 & 57, 2000.

Search Report for PCT US01 31813 Dated Jun. 17, 2003 in PCT filing from Parent U.S. Application No. 09 974,578 filed herewith.

Robertson, LD., et al., "Solid State Power Amplifier Using Impedance–Transforming Branch–Line Couplers for L–Band Satellite Systems," Proceedings of the 23rd European Mircowave Conference, Madrid, Sep. 6–9, 1993, Proceedings of the European Microwave Conference, Turnbridge Wells, Reed Exhibition Company, GB. Sep. 6, 1993, pp. 448–450, XP00629961, ISBN: 0–946821–23–2 Figures 1,3.

\* cited by examiner

DISTRIBUTED CIRCULAR GEOMETRY POWER AMPLIFIER ARCHITECTURE

CROSS-REFERENCE TO RELATED APPLICATIONS

This application claims the benefit of U.S. Provisional Application Nos. 60/239,470 and 60/239,474, both filed on Oct. 10, 2000 and U.S. Provisional Application No. 60/288,601, filed on May, 4, 2001.

BACKGROUND OF THE INVENTION

1. Field of the Invention

The present invention relates to high frequency power amplifiers and more particularly to techniques for combining, monolithically or otherwise, individual power amplifiers to achieve power combining and impedance transformation.

2. Description of the Related Art

The design of high frequency power amplifiers with reasonable power levels, efficiency and gain remains one of the major challenges in the pursuit of a single-chip integrated transceiver. Although several advances have been made in this direction, the design of a truly integrated power amplifier on a lossy substrate, such as silicon or silicon germanium has been an elusive goal.

Multiple external components such as bonding wires and external baluns have been used as tuned elements to produce output power levels in excess of 1W using CMOS transistors. See e.g., K. C. Tsai and P. R. Gray, "A 1.9 GHz, 1-W CMOS Class-E Power Amplifier for Wireless Communications," *IEEE Journal of Solid-State Circuits*, vol. 34, no. 7, pp. 962–969, July 1999 [1]; and C. Yoo and Q. Huang, "A Common-Gate Switched, 0.9W Class-E Power Amplifier with 41% PAE in 0.25 μm CMOS," *Symposium on VLSI Circuits Digest*, pp. 56–57, Honolulu, June 2000 [2]. Similar performance levels have been achieved with Si-Bipolar transistors. See, e.g. W. Simbürger, et al, "A Monolithic Transformer Coupled 5-W Silicon Power Amplifier with 59% PAE at 0.9 GHz," *IEEE Journal of Solid-State Circuits*, vol. 34, no. 12, pp. 1881–1892, Dec. 1999 [3]; and W. Simbürger, et al., "A Monolithic 2.5V, 1W Silicon Bipolar Power Amplifier with 55% PAE at 1.9 GHz," *IEEE MTT-S Digest*, vol. 2, pp. 853–856, Boston, June, 2000 [4].

Moreover, alternative technologies for active devices with higher breakdown voltages and higher substrate resistivity have been used to increase the output power and efficiency of integrated amplifiers. For example, LDMOS transistors with a breakdown voltage of 20V have been used on a semi-insulating substrate, but still this design delivers only 200 mW. See, Y. Tan, et al., "A 900-MHz Fully Integrated SOI Power Amplifier for Single-Chip Wireless Transceiver Applications," *IEEE Solid-State Circ.*, vol. 35, no. 10, pp. 1481–1485, October 2000 [5]. Further, GaAs MESFET's on insulating substrates have been used to integrate power amplifiers. J. Portilla, H. Garcia, and E. Artal, "High Power-Added Efficiency MMIC Amplifier for 2.4 GHz Wireless Communications," *IEEE Journal of Solid State Circuits*, vol. 34, no. 1, pp. 120–123, January 1999 [6]. Unfortunately, these technologies are significantly more costly and more difficult to manufacture than conventional silicon-based transistor technologies, such as CMOS.

A summary of these prior achievements in the design of high-frequency, low voltage power amplifiers is provided in Table 1:

TABLE 1

| Freq. (GHz) | $P_{out}$ (W) | Supply Voltage | PAB % | Wirebond Inductor? | External Components? | Active Device | Ref. No. |
|---|---|---|---|---|---|---|---|
| 1.9 | 1.0 | 2 | 41 | YES | YES | CMOS | [1] |
| 0.9 | 1.0 | 1.9 | 41 | YES | YES | CMOS | [2] |
| 0.9 | 5.0 | 4.5 | 59 | NO | YES | Si Bipolar | [3] |
| 1.9 | 1.4 | 2.5 | 55 | NO | YES | Si Bipolar | [4] |
| 0.9 | 0.2 | 5 | 49 | NO | NO | SOI LDMOS | [5] |
| 2.4 | 0.25 | 7 | 79 | NO | NO | MESFET | [6] |

Two significant problems in the design of a fully-integrated high speed solid state power amplifier using conventional silicon technologies such as CMOS are (1) the low resistivity of the lossy substrate which increases the loss of on-chip inductors and transformers; and (2) the low breakdown voltages of the transistors. These problems are exacerbated as the minimum feature sizes of the transistors (such as CMOS) are scaled down for faster operation.

More particularly, the high conductivity of lossy substrates causes long metal lines, including conventional spiral inductors fabricated on the same substrate, to be very lossy in terms of power. If the metal lines are made wide to reduce resistance, the capacitive coupling effect between the metal and substrate will drain part of the current to the substrate, thereby increasing power dissipation. On the other hand, if the metal lines are made narrow enough to effectively overcome this problem, the metal resistance will significantly increase, again absorbing (dissipating) a significant portion of the power.

The low breakdown voltage of conventional transistors such as CMOS, for example, limits the maximum allowable drain voltage swing of the transistor. This makes it necessary to perform some form of impedance transformation to achieve a larger output power. For example, a ±2V drain voltage swing delivers only 40 mW to a 50 Ω load if no such impedance transformation is performed. While impedance transformation can be achieved using a 1: n transformer, unfortunately, an on-chip spiral 1: n transformer on a standard CMOS substrate is very lossy and will degrade the performance of the amplifier greatly. Alternatively, an on-chip resonant match could be used, but this technique also results in significant power loss.

In sum, as all high frequency power amplifiers ostensibly require some inductors—essentially long metal lines—for matching purposes, connections for the supplies, and some form of power combining, conventional power amplifier circuits tend to be very power inefficient and not commercially viable above certain power and frequency levels.

Thus, it would be highly desirable to have a low cost, fully integratable topology for a power amplifier that can be fabricated with low cost, silicon-based processes and that can provide significant output power levels in the microwave and millimeter-wave frequency ranges. It would also be desirable if such a topology could be implemented with discrete power amplifiers as well as monolithic integration techniques. Ideally, this architecture would also be useful in the design of both lossy substrate IC's as well as non-lossy substrate IC's.

SUMMARY OF THE INVENTION

The present invention, which addresses these needs, resides in a distributed, circular-geometry, power amplifier as a means for power combining and impedance transformation to achieve a very high output power in a small package and to overcome the low breakdown voltage of conventional active devices such as short-channel MOS transistors.

In particular, the present invention resides in a distributed, circular geometry, power amplifier for amplifying an RF input signal that comprises a plurality of smaller push-pull amplifiers. Each amplifier includes two gain blocks that each has an input port with positive and negative terminals and an output port with positive and negative terminals. The two gain blocks of each push-pull amplifier are interconnected at the positive terminals of their respective output ports by an inductive path and share a common supply voltage to the positive terminals of their respective output ports. The negative terminal of the output port of each gain block of each push-pull amplifier is connected to negative terminal of the output port of a gain block of an adjacent push-pull amplifier such that the amplifiers are configured in an interconnected circular geometry, with the connected negative terminals of adjacent gain blocks being connected together to form a virtual ac ground.

In operation, the input port of each gain block is adapted to receive an ac input signal of at least substantially equal magnitude and opposite phase relative to the input port of an adjacent gain block. The push-pull amplifiers are interconnected such that, for the fundamental frequency of operation, virtual ac-grounds are presented at the negative terminals of the output ports of the gain blocks.

In a more detailed aspect of the present invention, the distributed circular geometry power amplifier comprises at least two push-pulls amplifiers designed to amplify an RF input signal. A first push-pull amplifier includes a first gain block and a second gain block, each block having an input port with positive and negative terminals and an output port with positive and negative terminals, the blocks being interconnected at the positive terminals of their respective output ports by an inductive path. A second push-pull amplifier includes a third gain block adjacent the second gain block and a fourth gain block, the third and fourth gain block each having an input port with positive and negative terminals and an output port with positive and negative terminals, the gain blocks of the second push-pull amplifier being interconnected at the positive terminals of their respective output ports by an inductive path. In order to create the "circular" closed loop, the second and third gain blocks are interconnected at the negative terminals of their respective output ports and the negative terminal of the output port of the fourth gain block is connected to the negative terminal of the output port of the first gain block such that substantially all ac current that flows from the fourth gain block flows into the first gain block. The fourth and first gain blocks may, but typically will not, be directly connected to each other. In a typical configuration, at least (and preferable more than) one additional push-pull amplifier having a pair of interconnected gain blocks is provided between the fourth and first gain block, such that the negative terminal of the output port of the fourth gain block is indirectly connected to the negative terminal of the output port of the first gain block via this at least one additional push-pull amplifier.

In a more detailed embodiment, the power amplifier further includes a third and fourth push-pull amplifier, thereby creating a quad-push-pull power amplifier with eight gain blocks. In particular, the third push-pull amplifier has fifth and sixth gain blocks, each having an input port with positive and negative terminals and an output port with positive and negative terminals, the fifth and sixth blocks being interconnected at the positive terminals of their respective output ports by an inductive path. Similarly, the fourth push-pull amplifier has seventh and eighth gain blocks, each block having an input port with positive and negative terminals and an output port with positive and negative terminals, the seventh and eighth blocks being interconnected at the positive terminals of their respective output ports by an inductive path. The quad-amplifier device is interconnected such that the negative terminal of the output port of the fourth gain block is connected to the negative terminal of the output port of the fifth gain block, the negative terminal of output port of the sixth gain block is connected to the negative terminal of the output port of the seventh gain block, and the negative terminal of output port of the eighth gain block is connected to the negative terminal of the output port of the first gain block.

The gain blocks that comprise the push-pull amplifiers used by the present invention may take various configurations, depending on the desired gain, circuit complexity, cost and other factors. In one basic embodiment, each gain block of each push-pull amplifier comprises a single three-terminal active device, such as a CMOS or bipolar transistor, having a cathode, an anode, and a control terminal. In another embodiment, each gain block of each push-pull amplifier comprises a compound device having at least a first and a last three-terminal active device. The active devices of each gain block are connected together in a cascoded fashion such that the cathode of the first active device serves as the negative terminal of the output port of each gain block, the anode of the last active device serves as the positive terminal of the output port of each gain block, and the control terminal of the first active device is the input port of the gain block. With this configuration, each push-pull amplifier, and thus the power amplifier, can advantageously supply more gain than can a single transistor per gain block design.

The power amplifier of the present invention enables the push-pull amplifiers to be monolithically integrated onto a single chip. Moreover, the inductive path of each push-pull amplifier may simply be a metal slab and more particularly a substantially straight metal slab.

In yet further improvements to the design of the present invention, the power amplifier may further include a resonant, harmonic tuning capacitor that is connected between the positive terminals of the output ports of adjacent gain blocks of adjacent push-pull amplifiers. The amplifier may also include an inductive loop disposed between the input ports of adjacent gain blocks of adjacent push-pull amplifiers in order to tune the impedance presented to the RF input signal.

Turning to the RF input side, in order for the circuit to operate properly, a balanced input must be provided to all input ports of all gain blocks. To address this, an input power splitting network is included that symmetrically connects an in-phase balanced input signal to be amplified to the input ports of all gain blocks. The input power splitting network may symmetrically connect the in-phase balanced input signal from a point inside the circular geometry of the power amplifier or from points outside the circular geometry of the power amplifier.

In the preferred embodiment, the power amplifier further includes a power-combining circuit connected to the push-pull amplifiers that combines the signals amplified by each of the push-pull amplifiers. In order to achieve power-combining, the push-pull amplifiers are preferably configured as a first closed loop to form a circular geometry primary winding of an active transformer and the power-combining circuit is configured as a secondary winding of the active transformer that is located in proximity with and magnetically coupled to the primary winding. Thus, the secondary winding has a single output that provides the summed outputs of the push-pull amplifiers in the closed first loop. The secondary winding may be a single turn circuit or multiple turn circuit.

Furthermore, the secondary winding may advantageously comprise a single or multiple turn inductors formed by a variable width metal line. The metal line has sections that are relatively wide where a low ac voltage is present relative to the substrate and relatively narrow where a high ac voltage relative to the substrate is present. This geometry offers the advantage of further reducing the power loss, as it takes advantage of low metal resistance of wider metal where the ac voltage signal is low, thus reducing the loss and takes advantage of low capacitive coupling to the substrate of a narrower metal where the ac voltage is high, thus again reducing the loss. In this fashion, both the metal resistance loss and capacitive coupling loss are reduced Turning momentarily back to the input circuit, the input power splitting network disclosed above may advantageously comprise a plurality of twisted input loops in proximity with the secondary winding, thereby providing magnetic coupling from the secondary winding. This geometry offers the advantage of further enhancing the gain or linearity of each push-pull amplifier in the power amplifier.

In yet a more detailed aspect of the preferred embodiment of the present invention, an additional secondary winding in proximity with and magnetically coupled to the primary and secondary windings may be provided to create an interdigitated transformer with its attendant benefits of lower power loss. Alternatively, or in addition to the multiple secondary winding improvement, the power amplifier of the present invention may further include at least one additional circular geometry primary winding in proximity with and magnetically coupled to the primary and secondary windings to create an interdigitated transformer.

A method of combining the amplified outputs of a plurality of push-pull amplifiers to form a power amplifier is also disclosed. In this method, each amplifier includes two inductively-gain blocks interconnected by an inductive path. The method comprises configuring the plurality of amplifiers to form a first closed loop such that adjacent gain blocks of adjacent amplifiers are interconnected and as so interconnected, form virtual ac grounds at their junctions, and driving adjacent gain blocks of adjacent push-pull amplifiers with at least substantially equal and opposite input signals. In a more detailed aspect of the present invention, the method further includes combining the output power of the push-pull amplifiers in the first closed loop in a secondary coil that is located in proximity with and magnetically coupled to the first closed loop.

A low loss inductor for deposition on a substrate of an integrated circuit that processes voltage signals is also described. The inductor includes an elongated conductive body deposed on the substrate and having first and second ends, conductive sections disposed between the ends, and an average ac signal voltage across the body, such that a section where the signal voltage is determined to be lower than the average ac signal voltage across the body is relatively wider than another section of the inductor whereat the signal voltage is determined to be higher than the average ac signal voltage across the body.

Additionally described is a method for reducing the electrical losses of an inductor deposed on a substrate of an integrated circuit, the inductor have an elongated body with interconnected conducting sections, an average width and an average ac signal voltage across the body. The method includes decreasing the width of a section of the body of the inductor relative to the average width whereat the ac voltage signal on the section is relatively higher than the average ac signal voltage across the inductor body; and increasing the width of another section of the body of the inductor whereat the ac voltage signal on the other section is relatively lower than the average ac signal voltage across the inductor body.

Other features and advantages of the present invention will become apparent from the following detailed description, taken in conjunction with the accompanying drawings, which illustrate, by way of example, the principles of the invention.

DETAILED DESCRIPTION OF THE PREFERRED EMBODIMENTS

The present invention improves the performance and efficiency of high-frequency power amplifiers, especially for those used in modern communications devices and systems.

The present invention discloses novel combinations of three-terminal active devices used as amplifiers or switches or used as components of amplifiers or switches. The term "gain block" is used herein to generically describe any component or combination of components that is capable of providing gain. Thus, a gain block may include a single three-terminal active device, such as a transistor, or a combination thereof. The three terminals of an active device are herein referred to as the "control terminal," the "anode", and the "cathode," corresponding, for example, to the gate, g, drain, d, and source, s, of a FET transistor, respectively, and corresponding to the base, collector, and emitter of a BJT transistor. Thus, these terms are to be understood in their broadest senses. Accordingly, the embodiments described and shown hereinbelow that employ FET transistors are merely illustrative and are by no means intended to limit the invention.

The design evolution leading to the preferred embodiments of the present invention is now described.

A) Push-Pull Driver

Figure 1A:
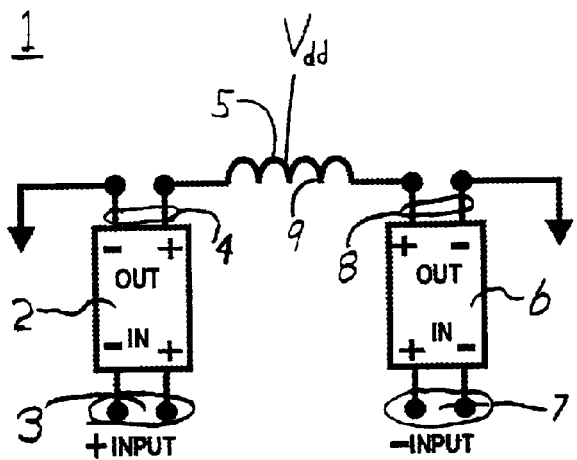
FIG. 1a is an illustrative diagram of a push-pull amplifier comprising a pair of gain blocks used as the basic building block for the present invention.

FIG. 1a shows a high level conceptual schematic of a basic push-pull amplifier design 1, which is used as the main building block of the distributed power amplifier of the present invention. The amplifier comprises a first gain block 2, having an input port 3 with positive and negative terminals and an output port 4 with positive and negative terminals, and a second gain block 6 having an input port 7 with positive and negative terminals and an output port 8 with positive and negative terminals. The amplifiers are connected together at their respective positive terminals of their outputs via an inductive path 9. As denoted by the "+" sign at input port 3 and the "−" sign at input port 7, the feature that makes this design a "push-pull" amplifier is that the input port 3 of gain block 2 and the input port 7 of gain block 6 are driven differentially, i.e., by equal amplitude, but opposite phase, RF signals. This topology creates a "virtual ac ground" near the center 5 of the inductive path 9 which, as shown, can be used as a point to supply dc bias $V_{dd}$ if desired, thereby reducing the filtering requirements on the supply.

Figure 1B:
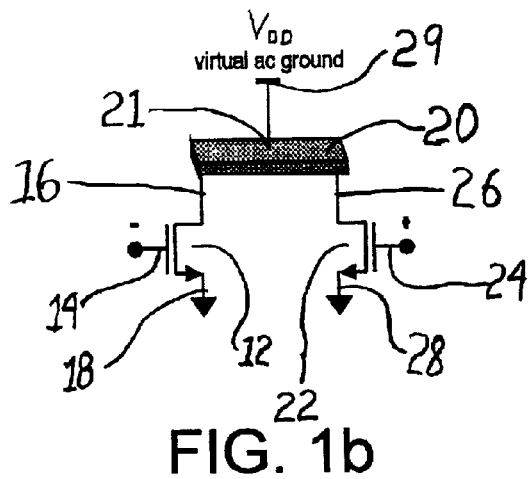
FIG. 1b is a diagram of one embodiment of the push-pull amplifier shown in FIG. 1a, wherein the gain blocks are single transistors interconnected by an inductive path.
Figure 1C:
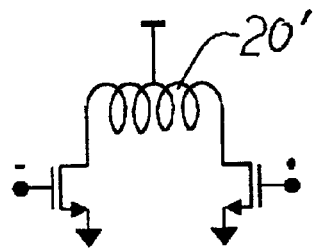
FIG. 1c is a circuit equivalent of the push-pull amplifier shown in FIG. 1b.

FIG. 1b shows one specific implementation of the push-pull amplifier shown in FIG. 1a. In this implementation, each gain block is simply a single three-terminal active device, shown here as a FET transistor. In particular, the amplifier comprises a first transistor 12 having a control terminal (gate) 14, an anode (drain) 16 and a cathode (source) 18 and a second transistor 22 having a control terminal (gate) 24, an anode (drain) 26 and a cathode (source) 28. The anodes 16 and 26 are interconnected by a metal slab 20 and biased with a common dc drain voltage $V_{dd}$ 29. As seen in the electrical equivalent drawing of FIG. 1c, the metal slab 20 acts as a drain tuning inductor 20' to resonate transistor parasitic capacitance and control harmonic signals. As discussed below, the slab can also act as, or as part of, a primary circuit of a distributed active transformer. As the inputs are differentially driven, this topology creates a virtual ac ground at the $V_{dd}$ supply node 21 (which is approximately, but not necessarily, at the midpoint of the metal slab 20) for the fundamental frequency and odd harmonics of the drain voltage. This virtual ground is an important feature of the push-pull driver, making it unnecessary to use a separate choke inductor and/or a large on-chip bypass capacitor at the supply.

The push-pull amplifier shown in FIG. 1b is used as the main building block for one preferred embodiment of the circular-geometry active-transformer power amplifier developed and shown below. However, it should be clearly understood that the push-pull amplifier used in the present invention is not limited to the single transistor pair shown in FIG. 1b. Fundamentally, the topology of the present invention encompasses any appropriately interconnected gain block pair driven as a push-pull amplifier. For example, each gain block, 2 and 6, shown in FIG. 1a could comprise a compound active device architecture to achieve higher gain than the single transistor pair.

Figure 1D:
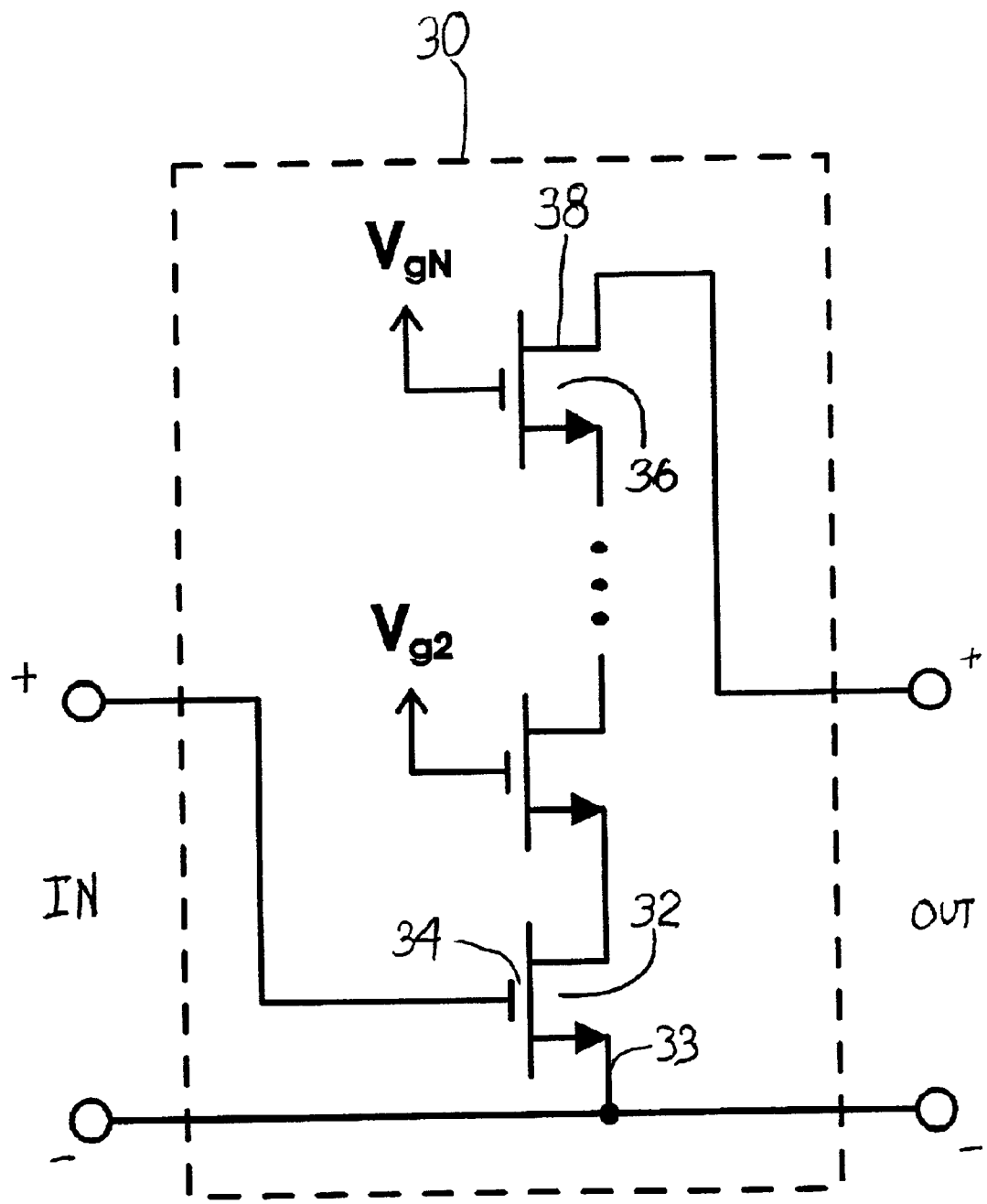
FIG. 1d is a circuit diagram of a second embodiment of the push-pull amplifier shown in FIG. 1a, wherein each gain block comprises multiple transistors cascoded together.

One such preferred embodiment is the cascode design wherein two or more active devices are cascoded together to create even higher gain push-pull amplifiers. In particular, in the cascoded gain block 30 shown in FIG. 1d, the cathode 33 of the first, common-cathode active device 32 serves as the negative terminal of the output port of the gain block, the anode 38 of the last cascode-connected active device 38 serves as the positive terminal of the output port of the gain block, and the control terminal 34 of the first, common-cathode device 32 is the positive input of the gain block. As further shown, one or more additional active devices may be connected between the first and last active devices to even further increase the gain of the gain block.

It will be understood that other known compound, active devices, such as the Darlington transistor pair, may be used as the gain blocks implemented by the present invention.

B) Quad-Push-Pull Circular Geometry

Figure 2A:
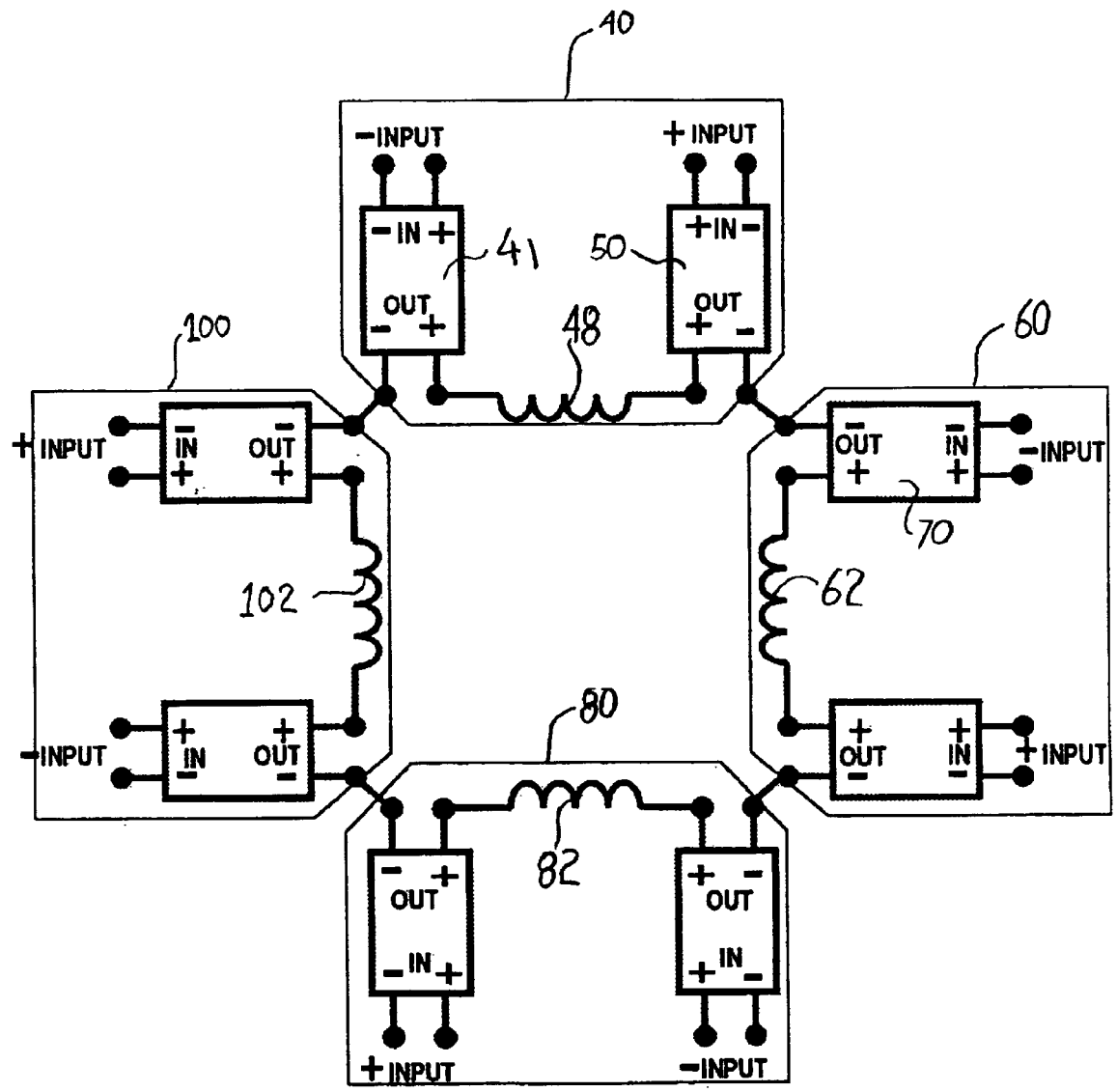
FIG. 2a is a high level schematic of one embodiment of the distributed, power-combining amplifier structure of the present invention, wherein four push-pull amplifiers of the type shown in FIG. 1a are interconnected at adjacent negative terminals of the outputs of adjacent amplifiers in a "circular geometry"

In one preferred embodiment, as shown in FIG. 2a, the "circular geometry" amplifier includes four push-pull amplifiers 40, 60, 80 and 100, totaling eight gain blocks of the type shown in FIG. 1a. As seen, the device is arranged such that gain blocks of adjacent amplifiers are interconnected at the negative terminals of their respective output ports to form a closed loop. Thus, as seen at one corner, the negative terminal of output port of gain block 50 of amplifier 40 is connected to the negative terminal of the output port of gain block 70 of amplifier 60.

Figure 2B:
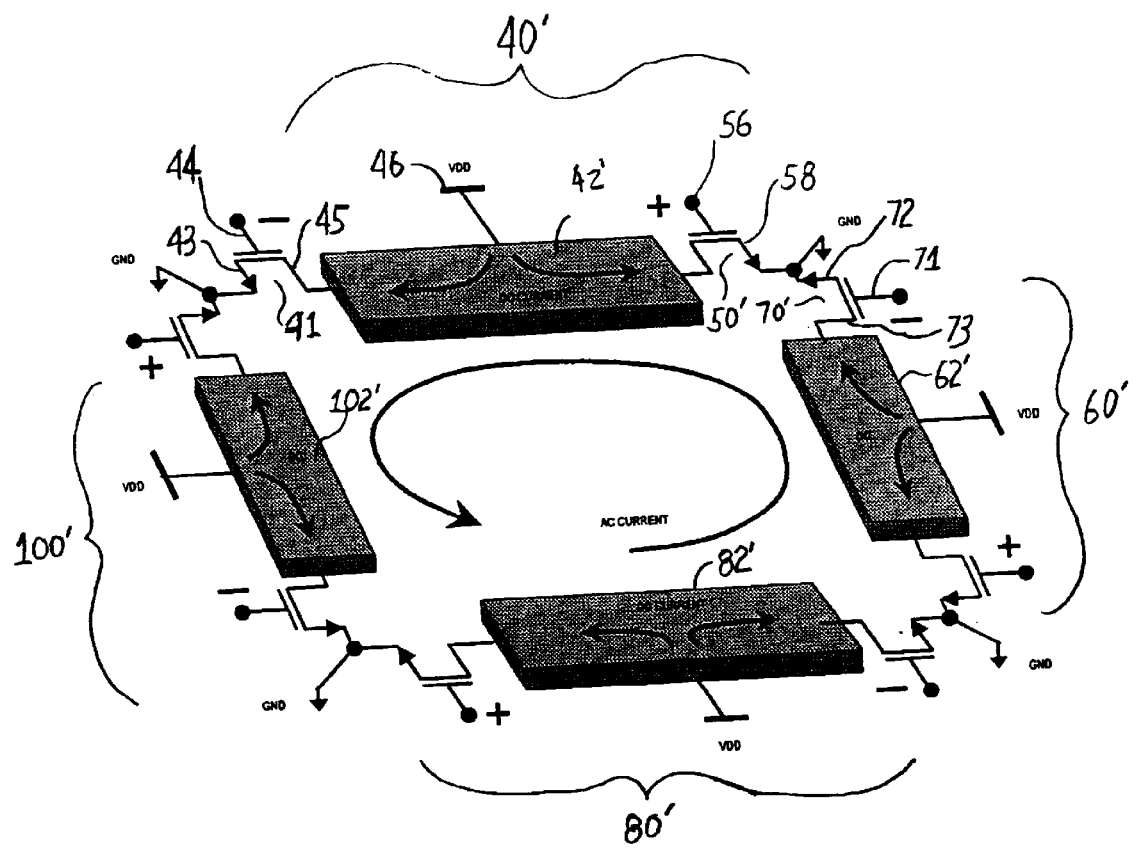
FIG. 2b is a schematic of one embodiment of the distributed, power-combining amplifier structure of the present invention, wherein four push-pull amplifiers of the type shown in FIG. 1b are interconnected at adjacent cathodes in a "circular geometry"

FIG. 2b shows one implementation of the amplifier of FIG. 2a, whereby each push-pull amplifier of the type shown in FIG. 1a is the simple two-transistor push-pull amplifier of the type shown in FIG. 1b and forms one side of a square. The strategic positioning of the four push-pull amplifiers 40', 60', 80' and 100' enables the use of four straight and wide metal lines 42', 62', 82', and 102', respectively, as the drain inductors. A slab inductor exhibits a higher quality factor, e.g. Q~20 to 30, than a spiral inductor with a Q~5 to 10, and hence will lower the power losses in the passive network. As seen, the slab inductors also provide inherently low resistance paths for the dc current to flow from the supply to the drains of the transistors.

At the corners, the sources of adjacent transistors of adjacent amplifiers are connected together and also share a common ground. As shown by the "+" and "−" symbols, at each corner the two adjacent transistors are driven in opposite phases. For example, cathode (source) 58 of transistor 50' of push-pull amplifier 40' and cathode (source) 72 of transistor 70' of amplifier 60' are interconnected and also connected to ground, labeled GND. Further, when the control terminal (gate) 56 of transistor 50' of push-pull amplifier 40' is driven by a positive phase signal, the control terminal (gate) 71 of transistor 70' of push-pull amplifier 60' is driven by the negative phase signal. In this way, a virtual ac ground is created in each corner of the square. This is a significant feature of the circular geometry, as the fundamental and odd harmonics of the ac signal will not leave the loop comprising the four metal slabs as shown by the current loop in FIG. 2b. Thus, any connection from this square to the supply voltage or ground will not carry any ac signals at the fundamental frequency or its odd harmonics. This practically limits the loss in the supply connection to dc ohmic loss of the connecting line, which can be easily minimized using wider metal line. Further, a very small or even no capacitor is required to filter the supply. It is noteworthy that the topology of FIGS. 2a and 2b does not form a virtual ground at the supply and ground nodes for the even harmonics. Thus, the transistors see relatively high impedance at the even harmonics compared to the fundamental and the odd harmonics. These adjacent transistors also share a common supply.

It should be understood that the four (4) push-pull amplifier design shown in FIGS. 2a and 2b and carried through the remaining figures, is but one example of the circular geometry topology of the present invention. The topology of the present invention includes at a minimum two (2) push-pull amplifiers interconnected and driven as described above, each push-pull pair comprising two (2) gain blocks. Increasing the number of interconnected push-pull pairs has two advantageous effects. First, the overall circuit output power capacity obviously increases with an increasing number of push-pull amplifiers. Second, the circuit increasingly takes on a circular shape. This is desirable because the topology increases in efficiency the more closely the circuit approaches the shape of a true circle.

This topology creates a distributed amplifier having individual radiating RF power outputs. In the embodiments described in section "D" below, the power outputs are combined to provide a single output that is essentially the sum of the individual outputs and that has a far greater efficiency than is conventionally obtainable. However, it should be understood that these outputs may or may not be electro-magnetically combined, depending on the application. For example, the outputs may simply radiate in free space or drive independent loads.

C) Impedance and Harmonic Control

Figure 3A:
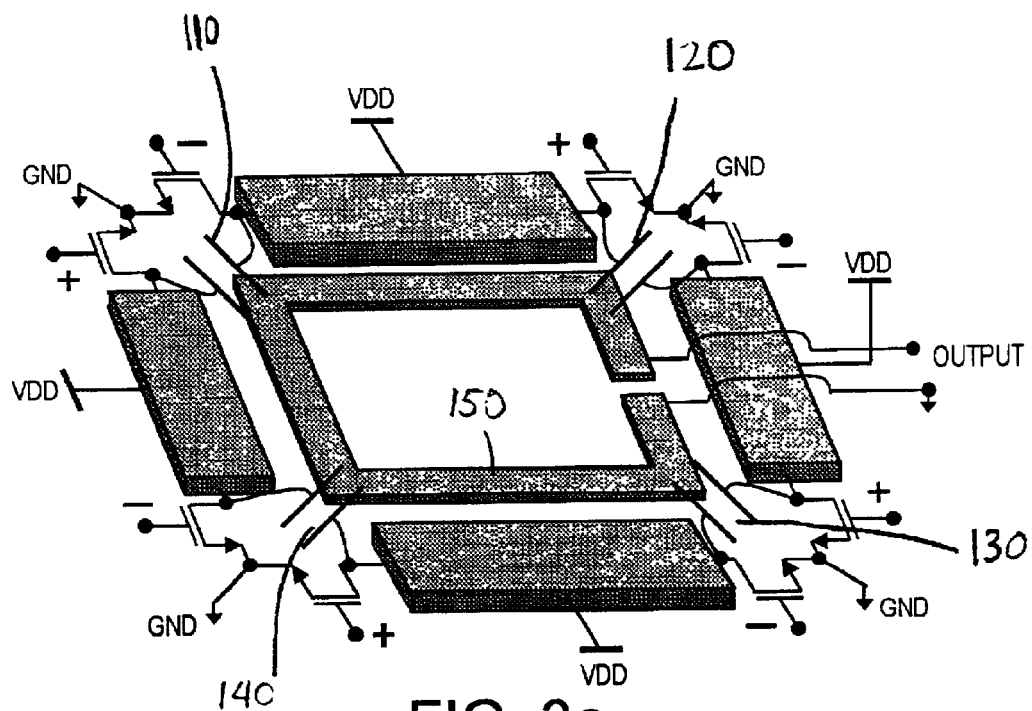
FIG. 3a is a schematic of an improvement to the distributed amplifier shown in FIG. 2b, wherein a one turn conducting coil for impedance transformation is bounded by the four push-pull amplifier structure and a resonant capacitor is connected between the anodes of the adjacent transistor pairs.
Figure 3B:
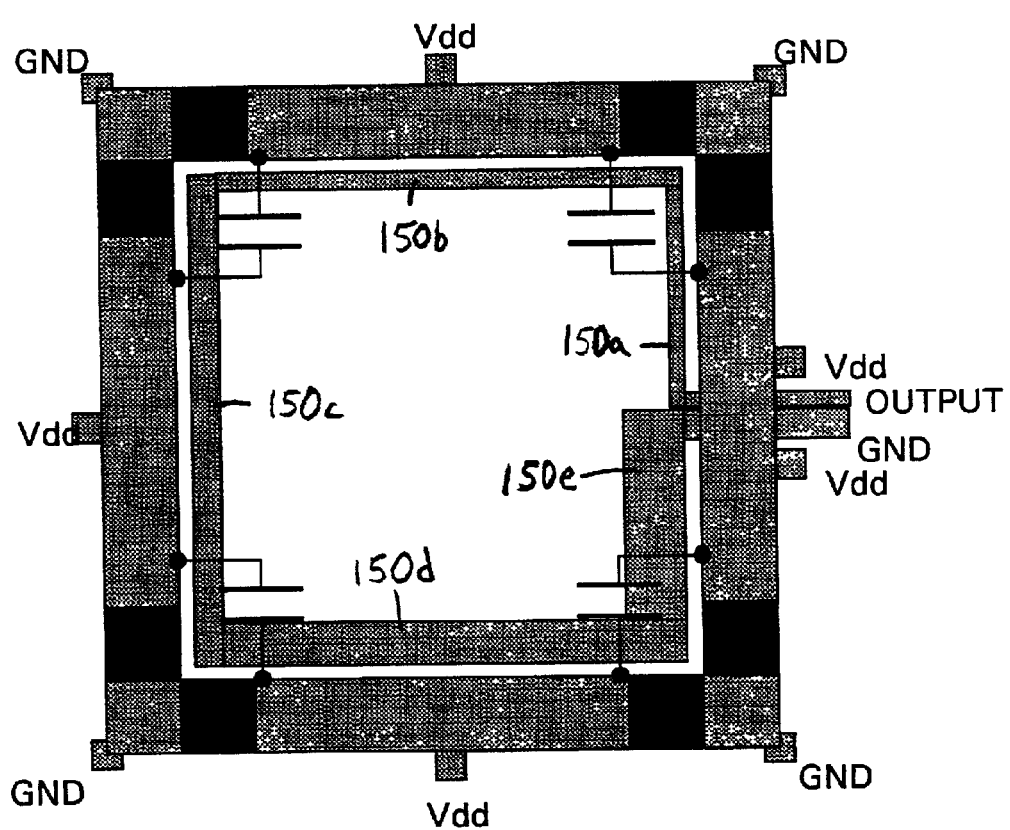
FIG. 3b is an illustrative diagram of an improvement to the distributed amplifier shown in FIG. 3a, wherein a one turn conducting coil for impedance transformation with variable width is bounded by the four push-pull amplifier structure and a resonant capacitor is connected between the anodes of the adjacent transistor pairs.

Providing the correct impedances to the power amplifier is crucial for correct operation. All amplifiers will need to present the correct impedance to the transistor at the fundamental frequency, and controlling the higher order harmonic content of the signal inside the amplifier plays a major role in the performance of a switching amplifier. As depicted in FIGS. 3a and 3b, these functions can be achieved by connecting four capacitors 110, 120, 130 and 140 between the drains of the adjacent transistors, one in each corner of the square. These capacitors assist in controlling the impedance seen by the transistors at the fundamental frequency, decrease the levels of the overtones at the output, and assist in providing to the transistors suitable impedances for use as a switching amplifier. Because of the inductor used in the basic push/pull circuit, unless appropriate measures are taken, the impedance presented to the transistors at the fundamental frequency will be significantly inductive. By placing these capacitors in parallel with the inductance, the impedance may be varied appropriately for the class of operation to be used. For instance, class-A operation would normally size the capacitor so that the impedance at the fundamental is purely resistive. The second benefit of the capacitors is that their low impedance at the harmonic overtones will aid in filtering these frequencies from the output signal, reducing the need for additional post-amplifier filtering. The third benefit, which is applicable when operated as a high-efficiency switching amplifier, is that the placement of this capacitor allows harmonic tuning appropriate for E/F operation to be achieved. Since they are connected between the drains of the two transistors, they will only affect fundamental and odd harmonics since the even harmonic voltages are equal in magnitude and phase on both terminals of the capacitors. Thus, these capacitors are used to obtain the desired inductive impedance at the fundamental frequency, and provide very low impedances at odd harmonics, while maintaining high impedances for even harmonics. This selective impedance control allows each push-pull amplifier to be driven as a power efficient switching amplifier operating in class "inverse F, " or in a group of classes called "class E/F", which includes, for example, class-$E/F_3$, and class-$E/F_{odd}$. This topology can also be used in many other amplifier classes, such as linear class-A, AB, B, and C or non-linear amplifier classes by adjusting the drain inductance and corner capacitance to resonate the transistor drain-bulk capacitance, thereby providing the appropriate load for these classes.

D) Output Power Combining

In the preferred embodiment, the quad-push-pull amplifier design shown in FIG. 2b, with its four relatively large slab inductors that creates the square geometry, is used as the primary circuit of a magnetically coupled active transformer to combine the output power of these four push-pull amplifiers and to match their small drain impedance to a typically 50 Ω unbalanced or balanced load. The ability to drive an unbalanced load is essential to avoid an external balun for driving commonly used single-ended antennas, transmission lines, filters and RF switches. As seen in FIG. 2b, these four push-pull amplifiers driven by alternating phases generate a uniform circular current at the fundamental frequency around the square resulting in a strong magnetic flux through the square.

As seen in FIG. 3a, a one-turn metal coil 150 inside this primary coil power amplifier square can be used to harness this alternating magnetic flux and act as the transformer secondary loop. It also provides an impedance transformation ratio of 8:1 to present impedance of approximately 6.25 Ω (50 Ω/8) to the drains of the transistors. Ignoring these losses, for a ±2V drain voltage swing in the linear mode of operation, this transformation and combining process raises the potential output power of the amplifier to a 50 Ω load from $P_{out} \approx V_{dd}^2/(2 \times R_{out})=2^2/(2 \times 50\ \Omega)=40$ mW to $P_{out} \approx 8 \times V_{dd}^2/(2 \times R_{out}/8)=8 \times 2V^2/(2 \times 50/8)=2.56$ W. As the transformer-coupling factor, k, is lower than 1 (typically around k=0.6–0.8) a capacitor, 204 is connected in parallel to the output (see FIG. 8) to compensate for the leakage inductance of the transformer.

In a variation to the secondary winding 150 shown in FIG. 3a, the secondary winding may advantageously comprise a variable width metal line. Conceptually, the metal line has sections that are relatively wide where a low ac voltage is present relative to the substrate upon which the metal line is deposed, and relatively narrow where a high ac voltage relative to the substrate is present. This geometry offers the advantage of further reducing the power loss, as it takes advantage of the lower metal resistance of wider metal where the ac voltage signal is low (relative to the substrate), thus reducing the loss and takes advantage of low capacitive coupling to the substrate of a narrower metal where the ac voltage is high (relative to the substrate), thus again reducing the loss. In this fashion, both the metal resistance loss and capacitive coupling loss are reduced Thus, for example, as seen in FIG. 3b, a variable metal width one turn square coil inside the primary coil is used to harness the alternating magnetic flux and act as the transformer secondary loop, which further improves the efficiency of the device. In particular, viewing counterclockwise from the output, straight sections 150a–150e of the relatively square secondary coil become progressively wider, thereby creating an unbalanced single turn square inductor. The average width of the inductor along the entire path may be the same as in nonvariable secondary loop case shown in FIG. 3a, thus keeping the same total conductor resistance while reducing the overall loss. Alternative geometries that provide reduced losses over inductors without varying widths are possible for this and other integrate circuit applications, such as a multiple turn square spiral, multiple turn circular spiral, a line inductor with graduating steps, a tapered line inductor and a meandering line inductor.

Turning back to FIG. 3a, due to the symmetry of the push-pull topology, the even harmonics are significantly rejected and are thus effectively not coupled to the secondary 150. Also the transistor drain to bulk capacitance and the corner capacitors will practically short-circuit all odd harmonics except the fundamental frequency signal, thus attenuating odd harmonics at the output.

The circular-geometry active-transformer topology of the present invention provides another benefit over the design of conventional harmonically-controlled amplifier classes (e.g., class F, inverse class F). Unlike these single-ended harmonically-controlled amplifier classes that require individual adjustments for each harmonic, this topology only requires adjustment at the fundamental frequency during the design process in order to realize class E/F designs. Once the fundamental frequency is set, all other harmonics will see the desired impedances automatically. This is because the E/F mode of operation can be achieved by presenting low impedances at selected odd harmonics, a capacitive impedance $1/j\omega C_s$) at the even harmonics, and a load impedance at the fundamental which is has an appropriate amount of inductance. The low impedances at odd harmonics is achieved using the relatively large tuning capacitors 110, 120, 130 and 140, which are effectively in parallel with the transistor drains at the odd harmonics. At the even harmonics, however, the transistors only "see" their own output capacitance. This is because each transistor has the same signal amplitude and phase at these frequencies and so all of the other components in the circuit which are connected between the transistors will conduct no current at these harmonics, making them have no effect on the impedance. The inductive fundamental impedance is achieved by tuning the parallel RLC circuit connected between the transistor drains to resonate at a slightly higher frequency than the fundamental. By varying this tuning, the inductance of the load at the fundamental frequency may be varied to achieve zero-voltage-switching conditions resulting in high efficiency operation. Thus by utilizing the circuit symmetry to separate the even and odd harmonics, the circuit provides low impedances at the odd harmonics, capacitive impedance at the even harmonics, and an the appropriate inductive load in such a way so that only the fundamental frequency impedance need be tuned carefully.

E) Input Power Splitting and Matching

Figure 4:
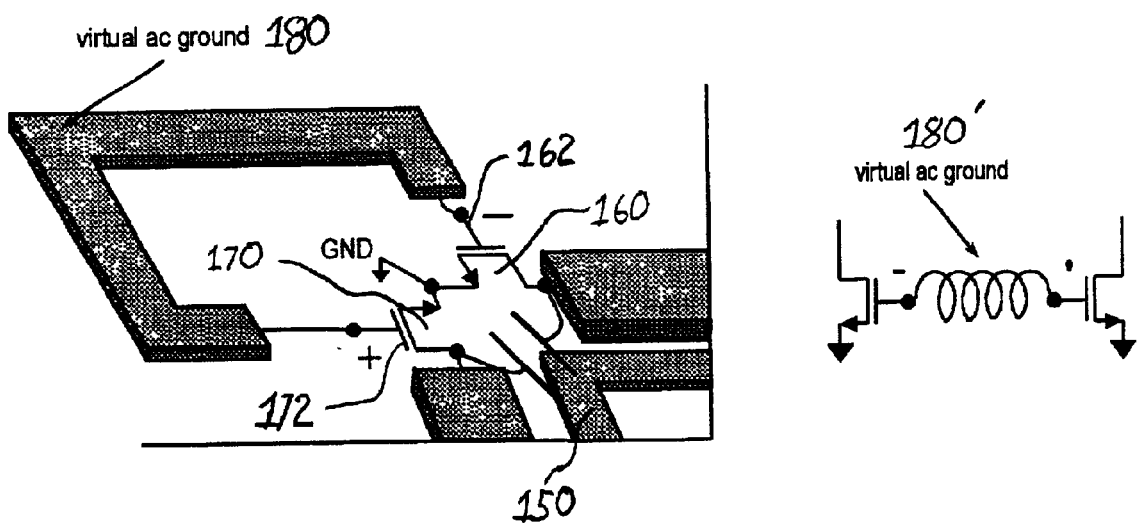
FIG. 4 is an illustrative diagram of an improvement to the distributed amplifier shown in FIG. 3 showing one representative corner of the quad push-pull amplifier design wherein a single loop inductor interconnects the control electrodes of adjacent transistors.

Turning now to the input signal, in the quad-push-pull design shown in FIGS. 2a, 2b and 3, a typical 50 Ω unbalanced input must be matched and transformed into four balanced drive signals at the eight (8) gates, resulting in similar challenges as those described with respect to the output network. To address this, a gate-matching inductive loop is connected between the gates at each corner of the square, for a total of four (4) loops, in order to resonate the gate capacitance at the fundamental frequency. One such corner is shown in FIG. 4, wherein an inductive loop 180 is connected between the gates 162 and 172 of transistors 160 and 170, respectively, and is shown schematically as an inductor 180'. The single, differentially driven loop inductor exhibits better Q (10–15) than normal spiral inductors. The middle points of these inductive loops form virtual ac grounds that make it unnecessary to use a large capacitor to ac ground this point, while blocking the dc voltage.

Figure 5:
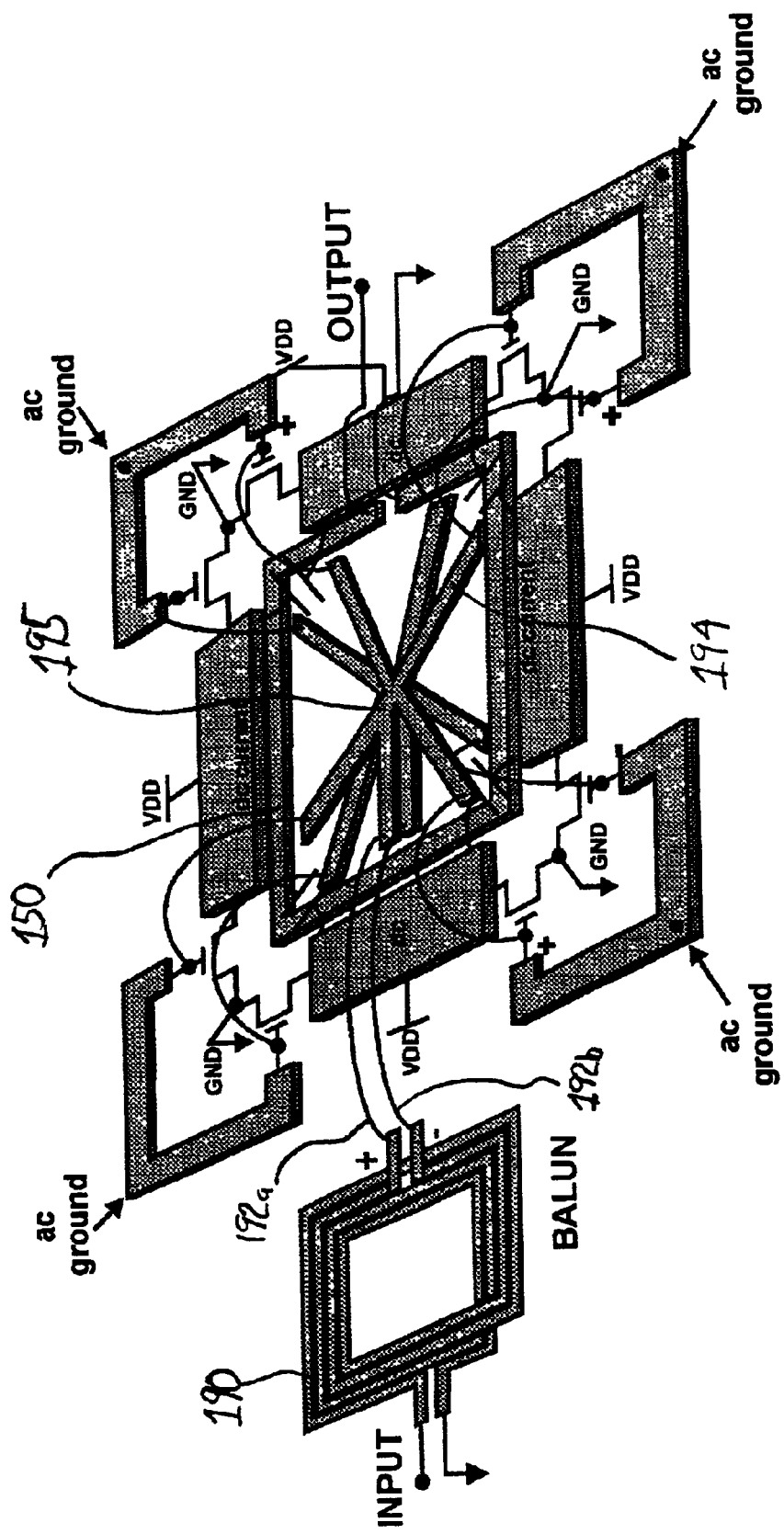
FIG. 5 is an illustrative diagram of the integrated circular geometry power amplifier of the present invention showing the novel input circuit and connection geometry of the input signal to each active device.
Figure 6:
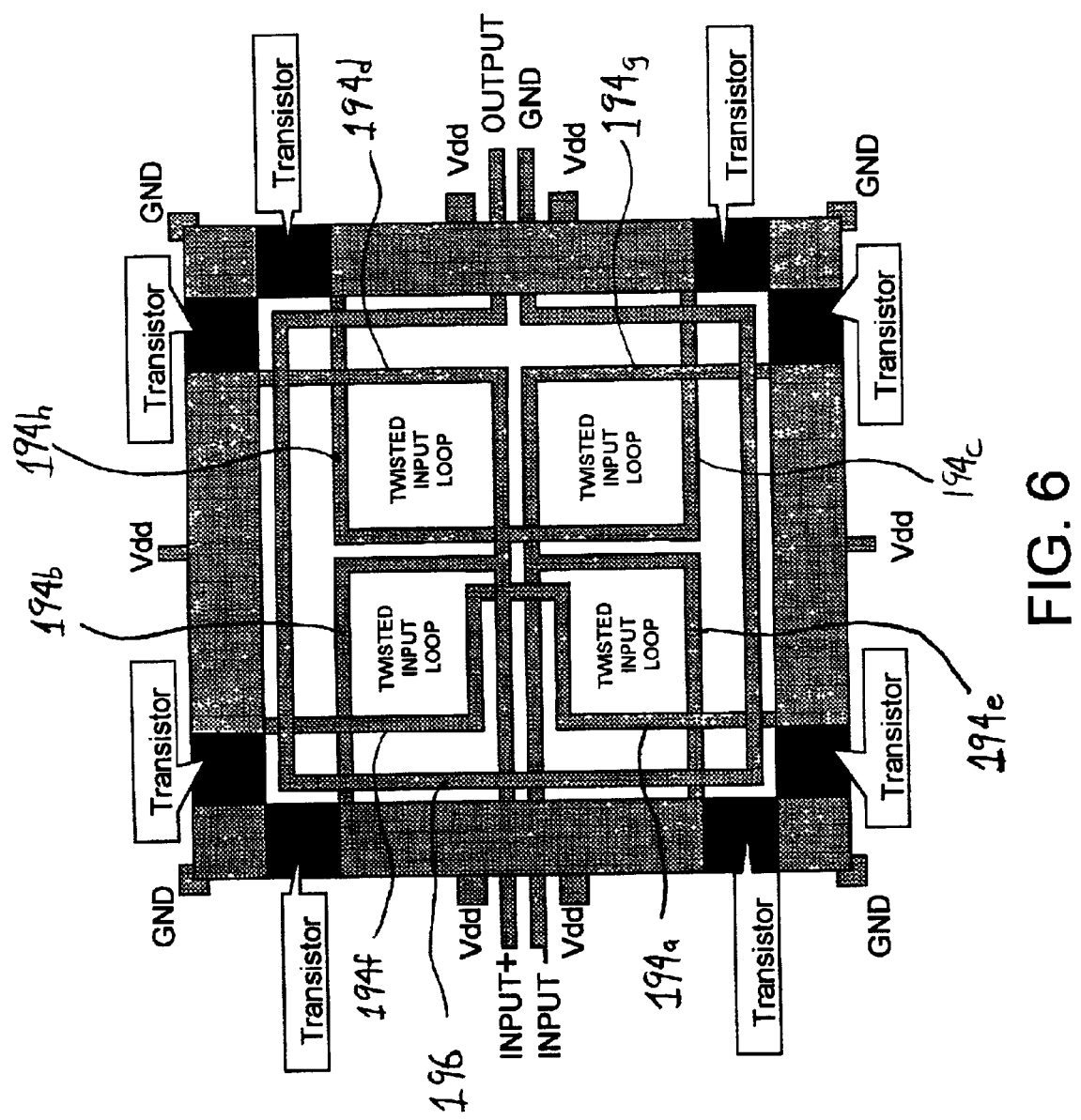
FIG. 6 is a top view of an illustrative diagram of the quad-push-pull active transformer power amplifier of the present invention showing an improved input connection geometry wherein positive feedback is supplied to the active devices.

As seen in FIG. 5, the input power splitting network consists of three parts, namely: (1) a 1:1 input spiral transformer balun 190; (2) the connecting differential lines 192a, 192b, that brings the balanced signal to a center point 195 of the square; and (3) the splitting network 194 symmetrically connecting the center point 195 to the gates of all transistors. Thus, the splitting network 194 provides in-phase balanced input signals to the gates of each push-pull pair transistor. In one preferred embodiment, illustratively shown in FIG. 6, the splitting network 194 comprises carefully shaped metal lines 194a–194f that take predetermined twisted paths to the transistors. This provides positive magnetic coupling from the output transformer (secondary coil) 196 to each input connection, thereby further enhancing the gain of each individual amplifier and thus the entire amplifier.

A parallel capacitor 205 (shown in FIG. 8) and series capacitors 206, 207a, and 207b are also inserted at the input to resonate the leakage inductance and provide matching to 50 Ω at the input side of the spiral 1:1 on-chip balun 190. It is noted that none of the bonding wires are used as inductors making it unnecessary to fine tune their value for optimum operation.

The input feeding can alternatively be made from the outside of the loop, thus reducing the power loss caused by currents induced in the metal lines due to magnetic coupling from the output.

F) Interdigitation

Figure 7A:
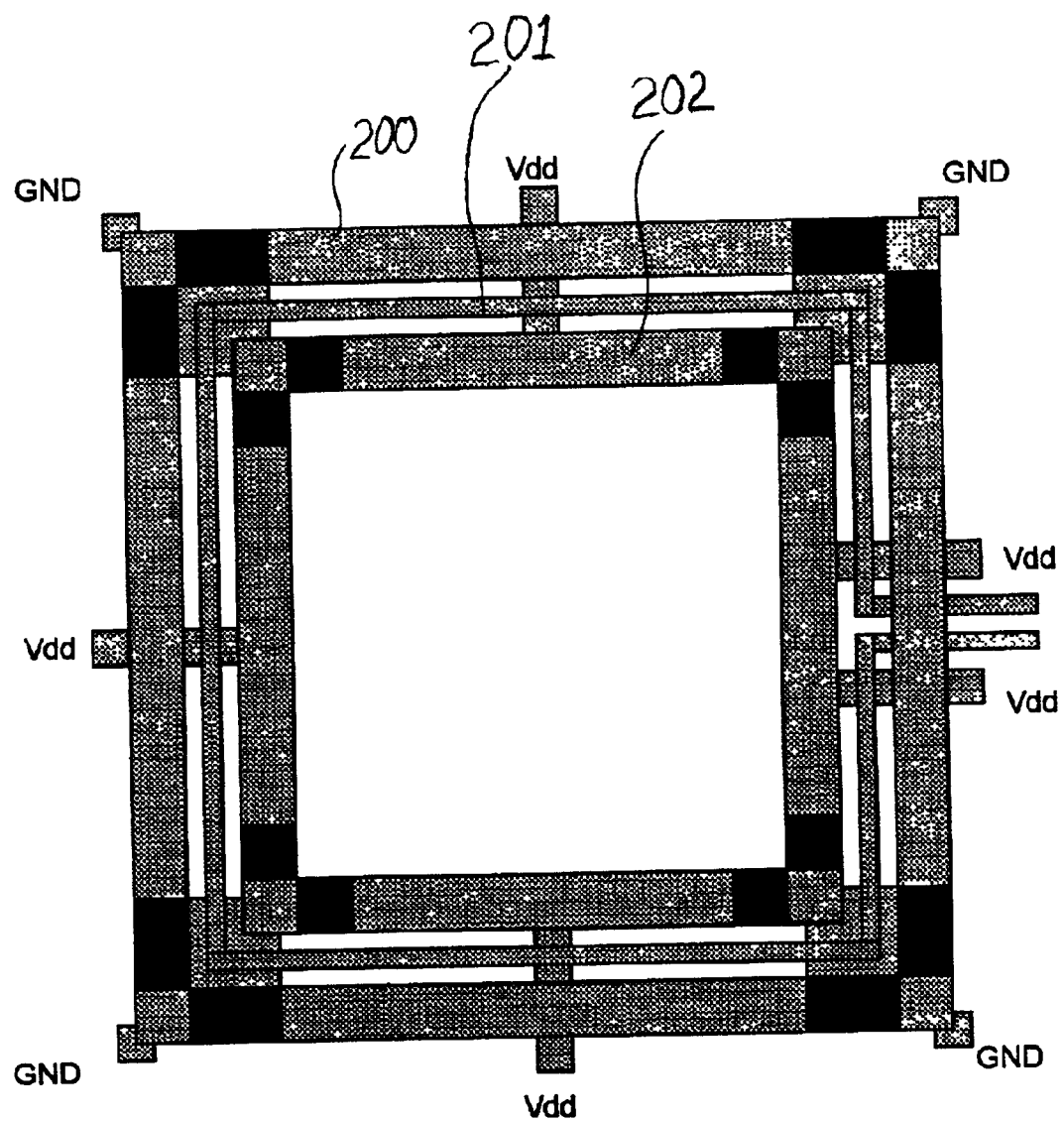
FIG. 7a illustrates yet a further improvement to the quad-push-pull active transformer power amplifier of the present invention wherein the input coil of the active transformer is interdigitated with the output coil.

A further improvement to the active-transformer power amplifier of the present invention is shown in FIG. 7a. In a high frequency planar active transformer of the type discussed herein, the current in the primary loop 200 tends to concentrate at the edges of their metal conductors facing the secondary circuit 204. Moreover, the current in the secondary circuit also concentrates at the edges of its conductor facing the primary winding. This "current crowding" increases the losses in the relatively wide metal conductors because the conductors are effectively being used as relatively narrow conductors having higher resistances.

Figure 7B:
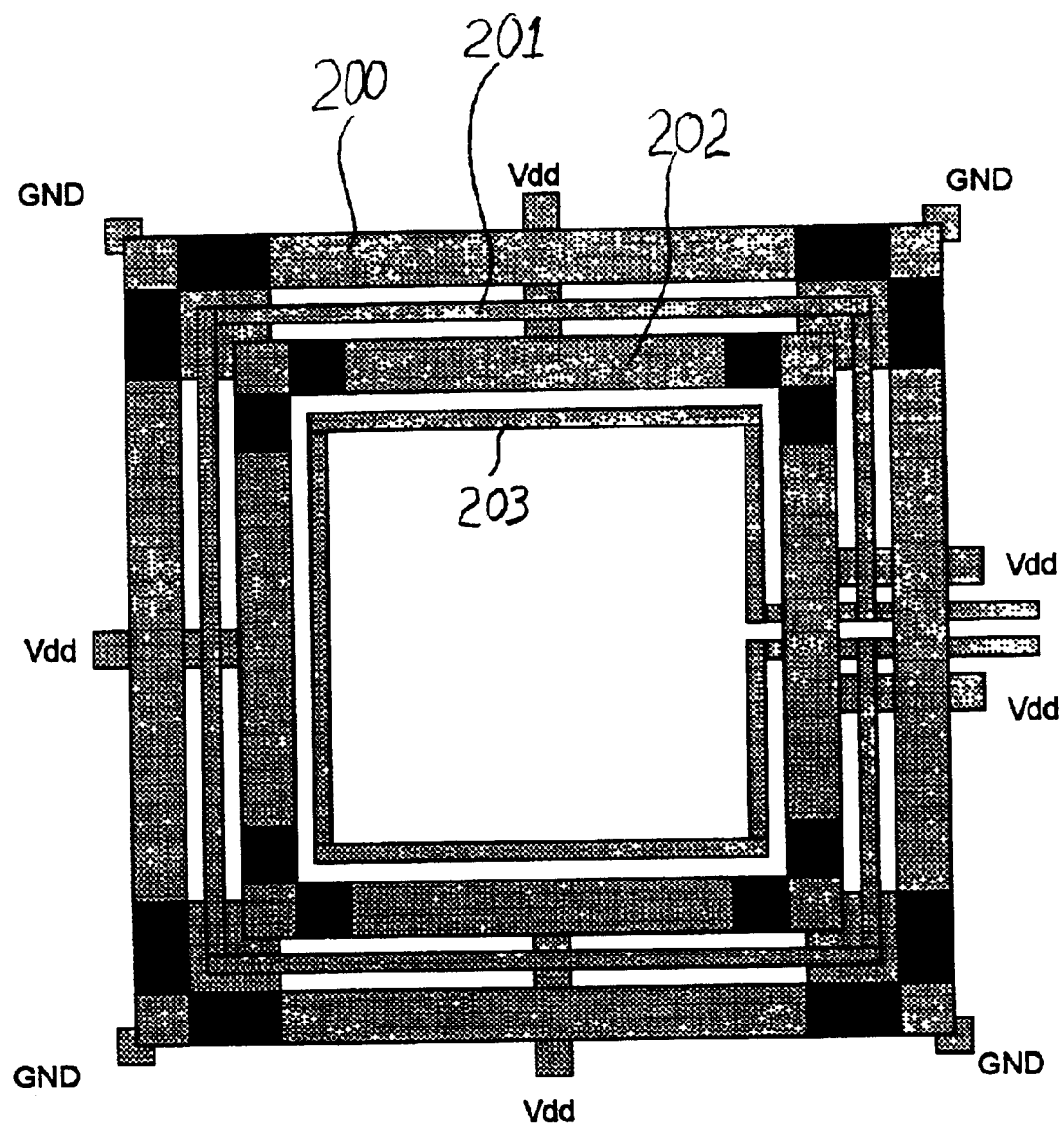
FIG. 7b illustrates an alternative interdigitation scheme to that shown in FIG. 7a, wherein multiple secondary loops are interdigitated with multiple primary loops.

In order to reduce these losses, the primary circuit may include a second loop 202 placed on the inside track of the secondary, or output loop 204, thereby "interdigitating" the coils. In this way, the current in the primary is split, or distributed, between the edges of the pair of input loops 200 and 202, effectively doubling the number of edges through which the current flows. This results in an effective lower overall metal resistance and hence lowers overall loss. It should be understood that the secondary loops may or may not be connected together. Alternative interdigitation schemes are also possible. One such scheme is shown in FIG. 7b, wherein multiple secondary loops are interdigitated with multiple primary loops.

G) Experimental Results

As stated above, the new circular geometry topology of the present invention can be used to implement both linear and switching power amplifiers. As a demonstration of the concepts of the present invention, a 2.2 W, 2.4 GHz single-stage fully-integrated circular-geometry switching power amplifier in class $E/F_3$ was fabricated and measured using 0.35 μm CMOS transistors in a BiCMOS process technology.

The process implemented three metal layers, the top one being 3 μm thick with a distance of 4.3 μm from the substrate, the substrate having a resistivity of 8 Ω·cm. The chip area is 1.3 mm×2.0 mm including pads. Quasi-3D electromagnetic simulation using SONNET and circuit simulation using ADS was performed on the complete structure as a part of the design cycle to verify performance of the amplifier.

Figure 8:
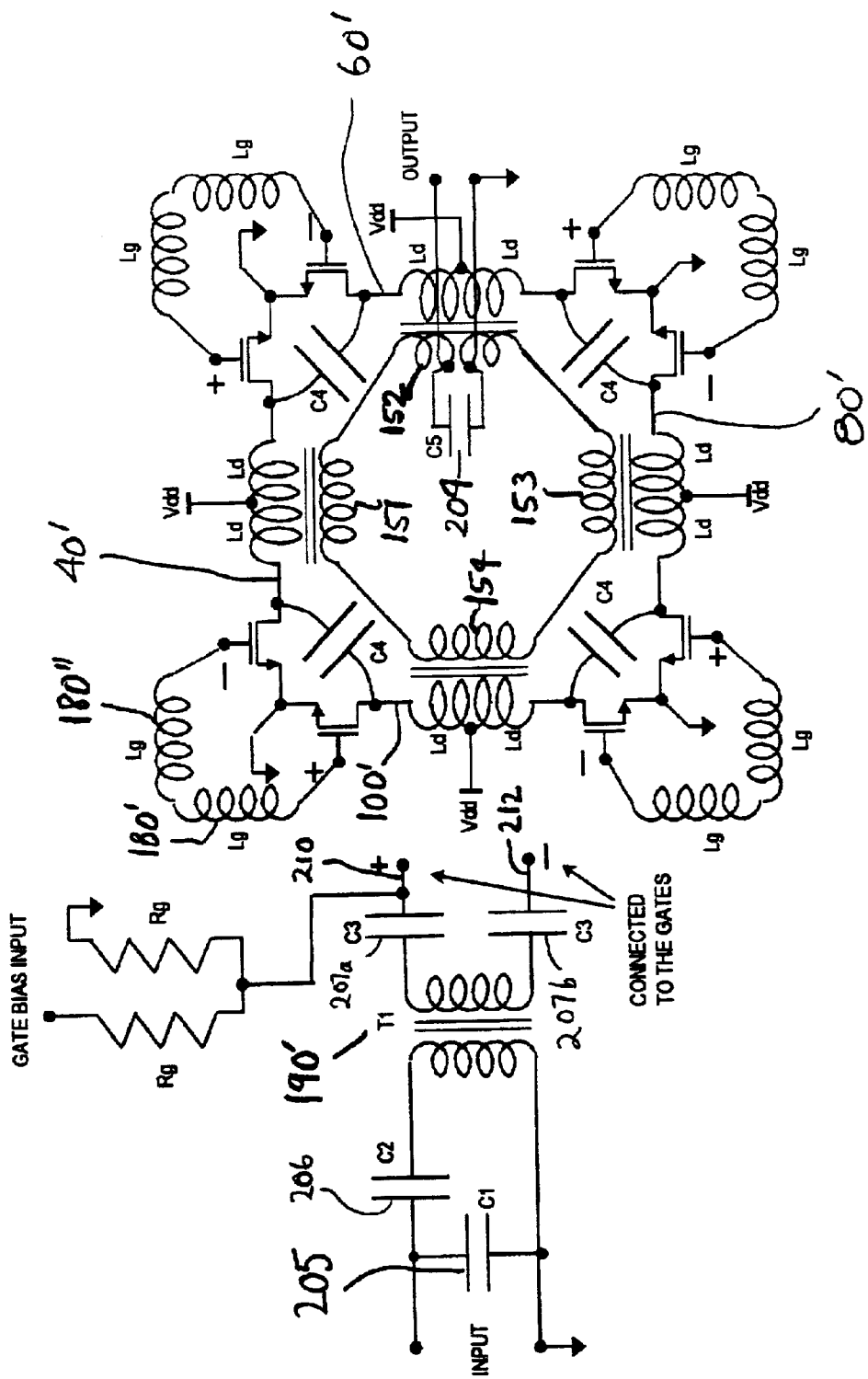
FIG. 8 is an electrical schematic of the quad push-pull circular geometry amplifier of the present invention with a signal input circuit shown.

The complete electrical diagram of the designed circuit is shown in FIG. 8. The electrical components in general correspond to the physical components illustratively shown in FIGS. 2–5. In particular, the four push pull amplifiers 40', 60', 80' and 100' that comprise the primary coil of the active transformer shown in FIG. 2b are illustrated in FIG. 8 as drain inductors $L_d$ with a transistor at each end that are driven in opposite phase from each other. The transistor input matching loop 180 of FIG. 4 is represented as gate inductors $L_g$ 180' and 180" and is repeated at each corner of the square. The square secondary coil 150 shown in FIGS. 3–5 is represented by four serially connected secondary coils of the transformer 151, 152, 153 and 154 that match each of the four primary coils that are part of push-pull amplifiers 40', 60', 80', and 100', respectively. The input matching transformer or balun 190 is shown as transformer T1, 190'. As indicated in the schematic (the physical connection not explicitly shown), the transformed, balanced input signal has a positive input 210 and a negative input 212 that is split to the correspondingly labeled inputs of the amplifier. Specifically, the positive input 210 is connected to the "+" phase gates of the appropriate transistor of each push pull amplifier and the "−" phase input 212 is connected to the "−" phase gates of the appropriate transistor of each push pull amplifier. The prototype also implemented the twisted input loop design shown in FIG. 6 for the input power splitting.

In measuring the performance of the design, the chip was glued directly to a gold plated brass heat sink using conductive adhesive to allow sufficient thermal dissipation. The chip ground pads were wire bonded to the heat sink. The input and output pads were wire bonded to 50 Ω microstrip lines on a printed circuit board (PCB). The supply and gate bias pads were also wire bonded. The input was driven using a commercial power amplifier connected to the circuit input through a directional coupler to measure the input return loss. The output was connected to a power meter through a 20 dB attenuator and 2.9 GHz low pass filter to avoid measuring harmonic signal powers. All system power losses were calibrated out, including the connector and Duroid board losses. The bond wire power loss was included in the amplifier's measured performance.

Figure 9:
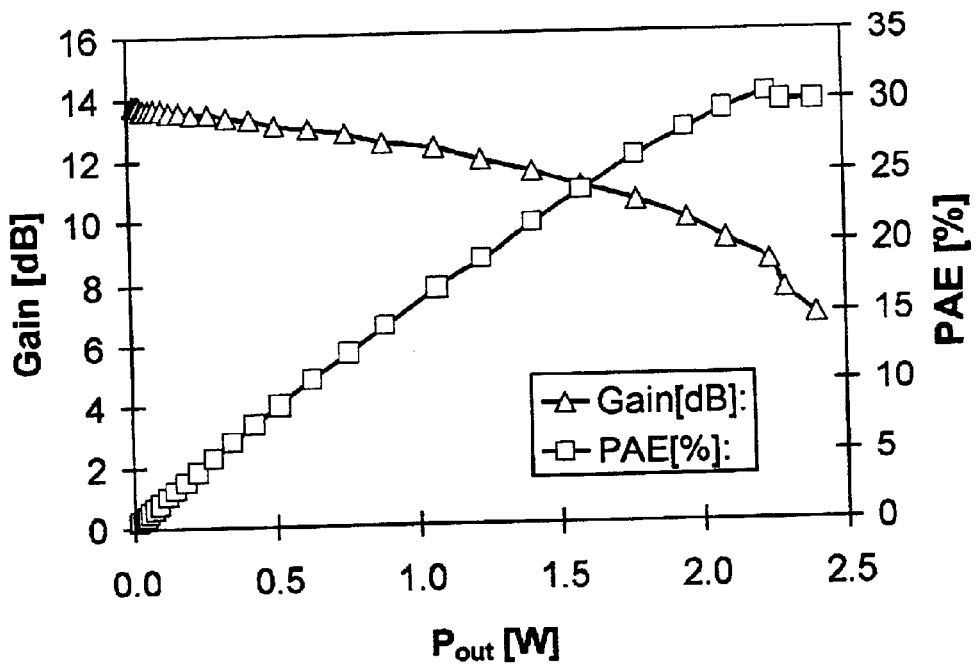
FIG. 9 is a graph showing the gain and power-added efficiency (PAE) versus output power of a fabricated 2.2 W, 2.4 GHz, single stage fully-integrated power amplifier designed according to the present invention when powered with a 2 volt supply.
Figure 10:
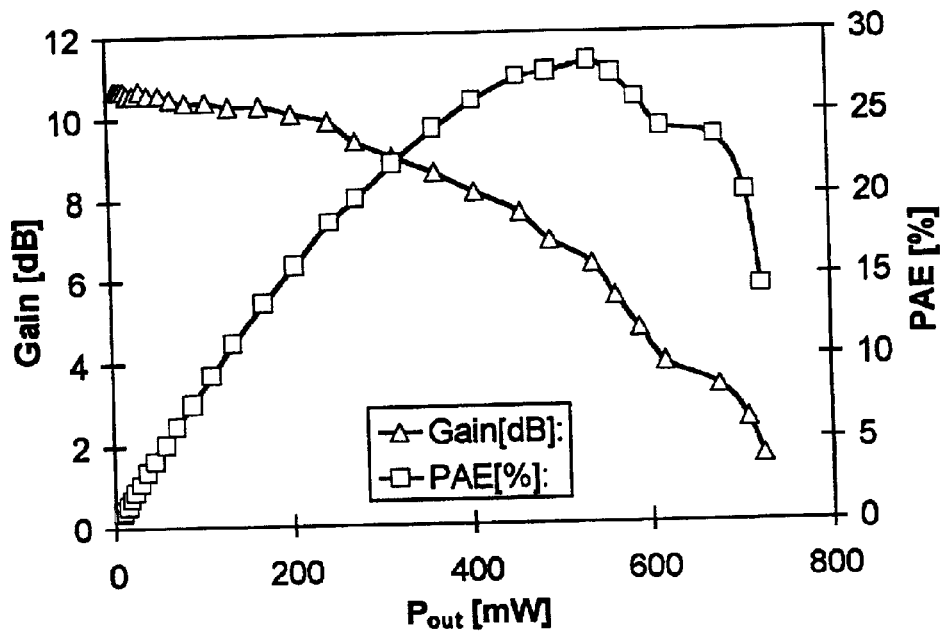
FIG. 10 is a graph showing the gain and PAE versus output power of a fabricated 2.2 W, 2.4 GHz, single stage fully-integrated power amplifier designed according to the present invention when powered with a 1 volt supply

An output power of 2.2 W at 2.4 GHz was obtained with 8.5 dB gain using a 2V power supply. The corresponding power added efficiency (PAE) was 31% and the drain efficiency was 36%. When the output was taken differentially, a PAE of 41% was achieved with Pout of 1.9 W, gain of 8.7 dB and drain efficiency of 48%. FIGS. 8 and 9 show the gain and PAE vs. output power for 2V and 1V supplies, respectively. Small signal gain was 14 dB and the input reflection coefficient was −9 dB. The 3 dB bandwidth was 510 MHz centered at 2.44 GHz. All harmonics up to 20 GHz were more than 64 dB below the fundamental. This chip demonstrated the viability and performance enhancements of the monolithic design of the present invention compared to conventional designs.

The present invention defines a technique for monolithically combining the output power of active devices. Having thus described exemplary embodiments of the invention, it will be apparent that further alterations, modifications, and improvements will also occur to those skilled in the art. Further, it will be apparent that the present invention is not limited to CMOS technology, to any specific frequency range, to any specific output power levels, to any specific number of active devices, to any class of operation or harmonic tuning strategy. Accordingly, the invention is defined only by the following claims.

We claim:

1. A distributed, circular geometry, power amplifier for amplifying an RF input signal, comprising:

a plurality of push-pull amplifiers, each amplifier including two gain blocks, each having an input port with positive and negative terminals and an output port with positive and negative terminals, wherein:

(i) the two gain blocks of each push-pull amplifier are interconnected at the positive terminals of their respective output ports by an inductive path and share a common supply voltage to the positive terminals of their respective output ports;

(ii) the negative terminal of the output port of each gain block of each push-pull amplifier is connected to negative terminal of the output port of a gain block of an adjacent push-pull amplifier such that the amplifiers are configured in an interconnected circular geometry, with the connected negative terminals of adjacent gain blocks being connected together to form a virtual ac ground; and (iii) the input port of each gain block is adapted to receive an ac input signal of at least substantially equal magnitude and opposite phase relative to the input port of an adjacent gain block.

2. A distributed, circular geometry, power amplifier, comprising:

(a) a first push-pull amplifier adapted to amplify an RF input signal, including a first gain block and a second gain block, each block having an input port with positive and negative terminals and an output port with positive and negative terminals, the blocks being interconnected at the positive terminals of their respective output ports by an inductive path; and (b) a second push-pull amplifier including a third gain block adjacent the second gain block and a fourth gain block, the third and forth gain blocks each having an input port with positive and negative terminals and an output port with positive and negative terminals, the gain blocks of the second push-pull amplifier being interconnected at the positive terminals of their respective output ports by an inductive path, wherein the adjacent second and third gain blocks are interconnected at the negative terminals of their respective output ports to form a virtual ac ground and the negative terminal of the output port of the fourth gain block is connected to the negative terminal of the first gain block such that substantially all ac current that flows from the fourth gain block flows into the first gain block, and wherein the input port of each adjacent gain block is adapted to receive an input signal of at least substantially equal magnitude and opposite phase.

3. The power amplifier of claim 2, wherein the push-pull amplifiers are interconnected such that, for the fundamental frequency of operation, virtual ac-grounds are presented at the negative terminals of the output ports of the gain blocks.

4. The power amplifier of claim 2, further including at least one additional push-pull amplifier having a pair of interconnected gain blocks, such that the negative terminal of the output port of the fourth gain block is indirectly connected to the negative terminal of the output port of the first gain block via the at least one additional push-pull amplifier.

5. The power amplifier of claim 2, further including (a) a third push-pull amplifier having fifth and sixth gain blocks, each block having an input port with positive and negative terminals and an output port with positive and negative terminals, the fifth and sixth blocks being interconnected at the positive terminals of their respective output ports by an inductive path, and (b) a fourth push-pull amplifier having seventh and eighth gain blocks, each block having an input port with positive and negative terminals and an output port with positive and negative terminals, the seventh and eighth blocks being interconnected at the positive terminals of their respective output ports by an inductive path, wherein the negative terminal of the output port of the fourth gain block is connected to the negative terminal of the output port of the fifth gain block, the negative terminal of output port of the sixth gain block is connected to the negative terminal of the output port of the seventh gain block, and the negative terminal of output port of the eighth gain block is connected to the negative terminal of the output port of the first gain block.

6. The amplifier of claim 2, wherein each gain block comprises at least a first and a last three-terminal active device each having a cathode, an anode and a control terminal, the active devices of each gain block being connected together in □ascade such that the cathode of the first active device serves as the negative terminal of the output port each gain block, the anode of the last active device serves as the positive terminal of the output port of each gain block, and the control terminal of the first active device is the input port of the gain block.

7. The power amplifier of claim 2, wherein the push-pull amplifiers are monolithically integrated.

8. The power amplifier of claim 2, wherein the inductive path of each push-pull amplifier is a metal slab.

9. The power amplifier of claim 8, wherein the inductive path is a substantially straight metal slab.

10. The power amplifier of claim 2, further including a resonant, harmonic tuning capacitor that is connected between the positive terminals of the output ports of adjacent gain blocks of adjacent push-pull amplifiers.

11. The power amplifier of claim 2, further including an inductive loop disposed between the input ports of adjacent gain blocks of adjacent push-pull amplifiers in order to tune the impedance presented to the RF input signal.

12. The power amplifier of claim 2, further including an input power splitting network that symmetrically connects an in-phase balanced input signal to be amplified to the input ports of all gain blocks.

13. The power amplifier of claim 12, wherein the input power splitting network symmetrically connects the in-phase balanced input signal from a point inside the circular geometry of the power amplifier.

14. The power amplifier of claim 12, wherein the input power splitting network symmetrically connects the in-phase balanced input signal from points outside the circular geometry of the power amplifier.

15. The power amplifier of claim 2, further including a power-combining circuit connected to the push-pull amplifiers that combines the signals amplified by each of the push-pull amplifiers.

16. The power amplifier of claim 15, wherein the push-pull amplifiers are configured as a first closed loop to form a circular geometry primary winding of an active transformer, and the power-combining circuit is configured as a secondary winding of the active transformer that is located in proximity with and magnetically coupled to the primary winding, the secondary winding having an output that provides the summed outputs of the push-pull amplifiers in the closed first loop.

17. The power amplifier of claim 16, wherein the secondary winding is a single turn circuit.

18. The power amplifier of claim 16, wherein the secondary winding is a conductive body having variable width sections.

19. The power amplifier of claim 16, further including an input power splitting network that symmetrically connects an in-phase balanced input signal to be amplified from a point inside the circular geometry of the power amplifier to each input port of each gain block.

20. The power amplifier of claim 19, wherein the input power splitting network comprises a plurality of twisted input loops in proximity with the secondary winding, thereby providing magnetic coupling from the secondary winding in order to enhance the gain or linearity of each push-pull amplifier.

21. The power amplifier of claim 16, further including at least one additional secondary winding in proximity with and magnetically coupled to the primary and secondary windings to create an interdigitated transformer.

22. The power amplifier of claim 16, further including at least one additional circular-geometry primary winding in proximity with and magnetically coupled to the primary and secondary windings to create an interdigitated transformer.

23. A distributed, circular geometry, power amplifier for amplifying an RF input signal, comprising:

a plurality of push-pull amplifiers, each amplifier including a first three-terminal active device and a second three-terminal active device, each active device having an anode, a cathode and a control electrode and adapted to amplify an input signal, wherein:

(i) the two active devices of each push-pull amplifier are interconnected at their respective anodes by an inductive path and share a common supply voltage to their respective anodes, (ii) the cathode of one active device of each push-pull amplifier is directly connected to the cathode of an adjacent active device of an adjacent push-pull amplifier such that the amplifiers are configured in an interconnected circular geometry, with the directly-connected cathodes of adjacent active devices being connected together to form a virtual ac ground, and (iii) the control electrode of each adjacent active device is adapted to receive an input signal of at least substantially equal magnitude and opposite phase.

24. A distributed, circular geometry, power amplifier, comprising:

(a) a first push-pull amplifier adapted to amplify an RF input signal, including
  (i) a first three-terminal active device having an anode, a cathode and a control electrode,
  (ii) a second three-terminal active device having an anode, a cathode and a control electrode, and
  (iii) an inductive path that interconnects the anodes of the first and second active devices, the anodes sharing a common supply voltage; and (b) a second push-pull amplifier adapted to further amplify the RF input signal, including
  (i) a third three-terminal active device adjacent the second active device and having an anode, a cathode and a control electrode,
  (ii) a fourth three-terminal active device having an anode, a cathode and a control electrode, and
  (iii) a second inductive path that interconnects the anodes of the third and forth active devices, the anodes of the third and fourth devices sharing a common supply voltage, wherein the first and second push-pull amplifiers are interconnected in a circular geometry such that the cathode of the second active device is connected to the cathode of the third active device to form a virtual ac ground, the cathode of the first active device is connected to the cathode of the fourth active device, such that substantially all ac current that flows from the fourth active device flows into the first active device, and wherein the control electrode of each adjacent active device is adapted to receive an input signal of at least substantially equal magnitude and opposite phase.

25. The amplifier of claim 24, wherein the cathode of the second active device is directly connected to the cathode of the third active device and the cathode of the first active device is indirectly connected to the cathode of the fourth active device via at least one additional push-pull amplifier.

26. The power amplifier of claim 25, further including
(a) a third push-pull amplifier having fifth and sixth active devices, each device having an anode, a cathode, and a control electrode, the fifth and sixth devices being interconnected at the anodes by an inductive path, and
(b) a fourth push-pull amplifier having seventh and eighth active devices, each device having an anode, a cathode, and a control electrode, the seventh and eighth devices being interconnected at the anodes by an inductive path, wherein the cathode of the fourth active device is connected to the cathode the fifth active device, the cathode of the sixth active device is connected to the cathode of the seventh active device, and the cathode of the eighth active device is connected to the cathode of the first active device.

27. The power amplifier of claim 24, wherein the push-pull amplifiers are monolithically integrated.

28. The power amplifier of claim 24, wherein the inductive path of each push-pull amplifier is a metal slab.

29. The power amplifier of claim 28, wherein the inductive path is a substantially straight metal slab.

30. The power amplifier of claim 24, further including a resonant, harmonic tuning capacitor that is connected in parallel with the push-pull amplifiers.

31. The power amplifier of claim 24, further including an inductive loop disposed between the two control electrodes of adjacent active devices of adjacent push-pull amplifiers in order to tune the impedance presented to the RF input signal.

32. The power amplifier of claim 24, further including an input power splitting network that symmetrically connects an in-phase balanced input signal to be amplified to each of the control electrodes of each active device.

33. The power amplifier of claim 32, wherein the input power splitting network symmetrically connects the in-phase balanced input signal from a point inside the circular geometry of the power amplifier.

34. The power amplifier of claim 32, wherein the input power splitting network symmetrically connects the in-phase balanced input signal from points outside the circular geometry of the power amplifier.

35. The power amplifier of claim 24, further including a power-combining circuit connected to the push-pull amplifiers that combines the signals amplified by each of the push-pull amplifiers.

36. The power amplifier of claim 35, wherein the push-pull amplifiers are configured as a first closed loop to form a circular geometry primary winding of an active transformer, and the power-combining circuit is configured as a secondary winding of the active transformer that is located in proximity with and magnetically coupled to the primary winding, the secondary winding having an output that provides the summed outputs of the push-pull amplifiers in the closed first loop.

37. The power amplifier of claim 36, wherein the secondary winding is a single turn circuit.

38. The power amplifier of claim 36, wherein the secondary winding is a conductive body having variable width sections.

39. The power amplifier of claim 36, further including an input power splitting network that symmetrically connects an in-phase balanced input signal to be amplified from a point inside the circular geometry of the power amplifier to each of the control electrodes of each active device.

40. The power amplifier of claim 39, wherein the input power splitting network comprises a plurality of twisted input loops in proximity with the secondary winding, thereby providing magnetic coupling from secondary winding in order to enhance the gain or linearity of each push-pull amplifier.

41. The power amplifier of claim 36, further including at least one additional secondary winding in proximity with and magnetically coupled to the primary and secondary windings to create an interdigitated transformer.

42. The power amplifier of claim 36, further including at least one additional circular-geometry primary winding in proximity with and magnetically coupled to the primary and secondary windings to create an interdigitated transformer.

43. A distributed, active-transformer, power-amplifier, comprising:

(a) a first push-pull amplifier, including a first three-terminal active device and a second three-terminal active device each having a cathode, an anode and a control electrode, the active devices being interconnected at their respective anodes by a first inductive path, the anodes sharing a common supply at a point on the inductive path;

(b) a second push-pull amplifier, including a third three-terminal active device and a fourth three-terminal active device each having a cathode, an anode and a control electrode, the third and forth active devices being interconnected at their respective anodes by a second inductive path, the anodes sharing a common supply at a point on the inductive path;

(c) a third push-pull amplifier, including a fifth three-terminal active device and a sixth three-terminal active device each having a cathode, an anode and a control electrode, the fifth and sixth active devices being interconnected at their respective anodes by a third inductive path, the anodes sharing a common supply at a point on the inductive path; and (d) a fourth push-pull amplifier, including a seventh three-terminal active device and an eighth three-terminal active device, each having a cathode, an anode and a control electrode, the seventh and eighth active devices being interconnected at their respective anodes by a fourth inductive path, the anodes sharing a common supply at a point on the inductive path;

the amplifiers being interconnected in a circular geometry such that the cathode of each active device of each amplifier is connected to the cathode of an adjacent active device of an adjacent amplifier, with both cathodes being interconnected to form a virtual ac ground, and each active device is operable in a phase opposite to the phase of an adjacent active device of an adjacent push-pull amplifier.

44. A method of combining the amplified outputs of a plurality of push-pull amplifiers to form a power amplifier, each push-pull amplifier having two inductively-interconnected gain blocks, comprising:

(a) configuring the plurality of amplifiers to form a first closed loop such that adjacent gain blocks of adjacent amplifiers are interconnected and as so interconnected, form virtual ac grounds;

(b) driving adjacent gain blocks of adjacent push-pull amplifiers with at least substantially equal and opposite input signals; and combining the output power of the push-pull amplifiers in the first closed loop in a secondary coil that is located in proximity with and magnetically coupled to the first closed loop, which by implication forms a primary coil in relation to at least the secondary coil.

* * * * *

UNITED STATES PATENT AND TRADEMARK OFFICE
CERTIFICATE OF CORRECTION

PATENT NO. : 6,816,012 B2
APPLICATION NO. : 09/974578
DATED : November 9, 2004
INVENTOR(S) : Ichiro Aoki et al.

It is certified that error appears in the above-identified patent and that said Letters Patent is hereby corrected as shown below:

At col. 15, line 13, replace "negative terminal of the first" with --negative terminal of the output port of the first--;

At col. 15, lines 48 and 52, replace "the negative terminal of output port" with --the negative terminal of the output port--;

At col. 15, line 59, replace "□ascade" with --cascode--.

At col. 18, line 52, replace "coupling from secondary" with --coupling from the secondary--.

Signed and Sealed this

Fourth Day of March, 2008

JON W. DUDAS
*Director of the United States Patent and Trademark Office*